(12) United States Patent
Hu et al.

(10) Patent No.: US 11,488,911 B2
(45) Date of Patent: Nov. 1, 2022

(54) FLIP-CHIP PACKAGE SUBSTRATE

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/049,893

(22) Filed: Jul. 31, 2018

(65) Prior Publication Data

US 2019/0341357 A1    Nov. 7, 2019

(30) Foreign Application Priority Data

May 7, 2018   (TW) .................................. 107115427

(51) Int. Cl.
    *H01L 23/00*    (2006.01)
    *H01L 23/31*    (2006.01)
    *H01L 23/498*   (2006.01)

(52) U.S. Cl.
    CPC ........ *H01L 23/562* (2013.01); *H01L 23/3128* (2013.01); *H01L 23/49816* (2013.01); *H01L 23/49822* (2013.01); *H01L 23/49827* (2013.01)

(58) Field of Classification Search
    CPC .............. H01I 23/562; H01L 23/49827; H01L 23/562; H01L 23/49822; H01L 23/3128; H01L 23/49816
    See application file for complete search history.

(56) References Cited

U.S. PATENT DOCUMENTS

2012/0133427 A1*  5/2012  Kim ........................ H01L 25/16
                                                    327/564
2019/0051592 A1*  2/2019  Kim ........................ H01L 23/15

* cited by examiner

*Primary Examiner* — Vongsavanh Sengdara
(74) *Attorney, Agent, or Firm* — Amin, Turocy & Watson, LLP

(57) ABSTRACT

A flip-chip package substrate is provided. A strengthening structure is provided on one side of a circuit structure to increase the rigidity of the flip-chip package substrate. When the flip-chip package substrate is used in large-scale packaging, the flip-chip package substrate can have good rigidity, so that the electronic package can be prevented from warping.

7 Claims, 8 Drawing Sheets

FLIP-CHIP PACKAGE SUBSTRATE

BACKGROUND

1. Technical Field

The present disclosure relates to flip-chip package technologies, and, more particularly, to a flip-chip package substrate with a strengthening structure.

2. Description of Related Art

With the evolution of semiconductor package technology, various specifications for packaging large-scale chips, such as artificial intelligence (AI) chips, higher order chips, or stacked chips, have been developed, such as 3D or 2.5D IC manufacturing process. These packaging techniques are being applied to higher order products of high density circuits/high number of stacking layers/large-scale designs, such as AI chips, GPUs, etc.

In view of the trend, large-scale flip-chip package substrates, such as 40*40 mm$^2$, 70*70 mm$^2$ or other bulky substrates, have been adopted for carrying large-scale chips, such as AI chips, higher order chips or stacked chips.

As shown in FIG. 1A, an electronic device 1 includes a circuit board 18, a flip-chip package substrate 1a disposed on the circuit board 18, and a semiconductor chip 19 attached on top of the flip-chip package substrate 1a. More specifically, as shown in FIG. 1B, the flip-chip package substrate 1a includes a core layer 10, circuit structures 11 provided on both sides of the core layer 10, and solder resist layers 12 formed on the circuit structures 11. The core layer 10 has electrically conductive through holes 100 for electrically connecting circuit layers 110 of the circuit structures 11. The circuit structures 11 further include at least one dielectric layer 111 enclosing the circuit layers 110, and outermost ones of the circuit layers 110 of the circuit structures 11 are exposed from the solder resist layers 12, serving as contacts (I/O) 112 that are to be bonded to the circuit board 18 and the semiconductor chip 19 via the solder materials 13 and 13".

In a traditional manufacturing process of the core layer 10, a base consisting of glass fiber and epoxy resin, such as Bismaleimide Triazine (BT), FR4, FR5, etc. is employed. A through-hole drilling process, such as mechanical drilling, laser drilling, or double tapered blind hole forming process, is performed on the base to form through holes. An electrically conductive material is then electroplated and a resin is filled in the holes.

However, as shown in FIG. 1A, during the packaging process of the traditional electronic product 1, when the flip-chip package substrate 1a is used in large-scale packaging, the rigidity of the flip-chip package substrate 1a is insufficient, such that during the high-temperature packaging process, warpage may occur in the flip-chip package substrate 1a due to different coefficient of thermal expansions (CTEs) between the various layers of materials in the flip-chip package substrate 1a. This may lead to poor connection between the flip-chip package substrate 1a and the semiconductor chip 19 (e.g., solder materials 13' are not bonded together), or even electrical failure or cracking of the semiconductor chip 19 due to stress.

Moreover, if the thickness h of the core layer 10 (as shown in FIG. 1B) is increased, for example, from 0.6 mm to 1.0 mm or more, to increase the rigidity of the flip-chip package substrate 1a and reduce warpage of the flip-chip package substrate 1a, problems such as those listed below may arise due to increased thickness h of the core layer 10.

Increasing the thickness of the core layer 10 goes against the need for more compact or miniaturized packaging designs. More specifically, increasing the thickness of the core layer 10 in order to eliminate warpage of the flip-chip package substrate 1a increases the thickness of the overall flip-chip package substrate 1a, this is unfavorable to the manufacturing of the substrate, and not to mention the increase of the production cost.

Increasing the thickness of the core layer 10 makes it harder to form fine pitch between the conductive through holes 100. More specifically, when the thickness of the core layer 10 is increased, under traditional techniques, the diameter of the conductive through holes 100 has to increase, in other words, the end surfaces (aperture w) of the conductive through holes 100 cannot be minimized, which means that the intervals between the conductive through holes 100 cannot be effectively minimized.

Increasing the thickness of the core layer 10 makes it harder to form fine line spacing. More specifically, when the thickness of the core layer 10 is increased, the size and the aspect ratio of the conductive through holes 100 are also increased, i.e. the conductive through holes 100 need to have an aperture w that is large enough to accommodate the increase of the depth (thickness h) (for example, the thickness h of the core layer 10 was 0.8 mm with an aperture of 0.1 mm, when the thickness h is changed to 1.2 mm, an aperture w of 0.2 mm or more is needed). Therefore, under traditional techniques, the diameters of the conductive through holes 100 must be larger (otherwise mechanical or laser drilling cannot be performed), which reduces the area available for circuit layout. This makes it harder to produce circuit layers 110 with finer lines and spacing.

As the depth (thickness h) of the conductive through holes 100 is increased, it becomes more challenging to fill the conductive through holes 100 or electroplate the conductive layers 100a therein. More specifically, it is difficult for the filler to be filled or the electrically conductive material to be electroplated uniformly in the holes.

Resistance becomes higher and electrical performance becomes poorer. More specifically, since the thickness h of the core layer 10 is increased, the overall thickness of the flip-chip package substrate 1a is also increased, longer conductive paths lead to higher resistances and poorer electrical performance.

Heat dissipation becomes poorer. More specifically, increasing the thickness h of the core layer 10 increases the thickness of the flip-chip package substrate 1a, which is bound to makes it more difficult to dissipate heat, leading to poor heat dissipation and lower overall efficiency and product life.

In addition, the dielectric layer 111 of the traditional circuit structure 11 is made of thin film dielectric material, such as Ajinomoto Build-up Film (ABF). If a prepreg (PP) glass fiber is used instead to reduce warpage, other shortcomings may be encountered. For example, when laser blind vias are being manufactured on the glass fiber PP, it is difficult to produce fine blind vias and the manufacturing cost is increased.

Also, as shown in FIG. 1C, a flip-chip package substrate 1a' is a coreless substrate, which has better electrical quality than the flip-chip package substrate 1a having the core layer 10, and the widths and spacing of its lines are not dependent on any conductive through holes 100 of the core layer 10. However, the coreless flip-chip package substrate 1a' has even poorer rigidity and is bound to create more warpage during high-temperature packaging process.

Therefore, there is a need for a solution that addresses the aforementioned issues in the prior art.

SUMMARY

In view of the aforementioned shortcomings of the prior art, the present disclosure provides a flip-chip package substrate, which includes: a circuit structure having a first side and a second side opposite to the first side; and a strengthening structure disposed on at least one of the first side and the second side of the circuit structure.

In an embodiment, the circuit structure includes at least one dielectric layer and a circuit layer formed on the dielectric layer. In another embodiment, the circuit structure further includes a core layer, on which the dielectric layer and the circuit layer are formed.

In an embodiment, the core layer may include a plurality of conductive portions electrically connected with the circuit layer. In another embodiment, the conductive portions are conductive through holes. In yet another embodiment, each of the conductive portions is a single pillar or a plurality of stacked pillars that are in contact with one another.

In an embodiment, the strengthening structure may include a rigid layer made of a conductive or insulating material. In another embodiment, the strengthening structure further includes an insulating portion for covering the rigid layer, and the rigid layer is bonded onto the circuit structure by the insulating portion. In yet another embodiment, the insulating portion may include a bonding layer for bonding with the circuit structure and a protective layer for covering the rigid layer.

In an embodiment, the strengthening structure further includes an insulating portion bonded onto the circuit structure.

In an embodiment, the flip-chip package substrate may further include conductive elements disposed on and electrically connected with the circuit structure, and positioned in and exposed from the strengthening structure.

In an embodiment, the circuit structure is of a coreless type.

The present disclosure also provides an electronic package, which includes the aforementioned flip-chip package substrate, and an electronic component disposed on at least one of the first side and the second side of the circuit structure.

In an embodiment, the aforementioned electronic package may further include an encapsulating layer disposed on the circuit structure for covering and bonding the electronic component.

It can be understood from the above that the flip-chip package substrate and the electronic package according to the present disclosure have their rigidity increased by providing a strengthening structure on a side of the circuit structure. Therefore, compared to the prior art, the present disclosure prevents warpage from occurring in the electronic package during a high-temperature process, and allows for the compact flip-chip package substrate design, fine spacing between conductive through holes, and increased line density without the need for a thick core layer, which makes it easier to fill or electroplate the conductive through holes. The thin core layer also improves heat dissipation and electrical performance by reducing resistance, and reduces cost in manufacturing the core layer. The strengthening structure can also facilitate heat dissipation.

Moreover, the present disclosure can be applied to a large scale electronic package without warpage during packaging, and also reduce the warpage due to the thermal effect, decreasing of electrical performance, or an invalid chip, thereby facilitating the compact design for a package substrate.

DETAILED DESCRIPTION OF THE EMBODIMENTS

Figure 1A:
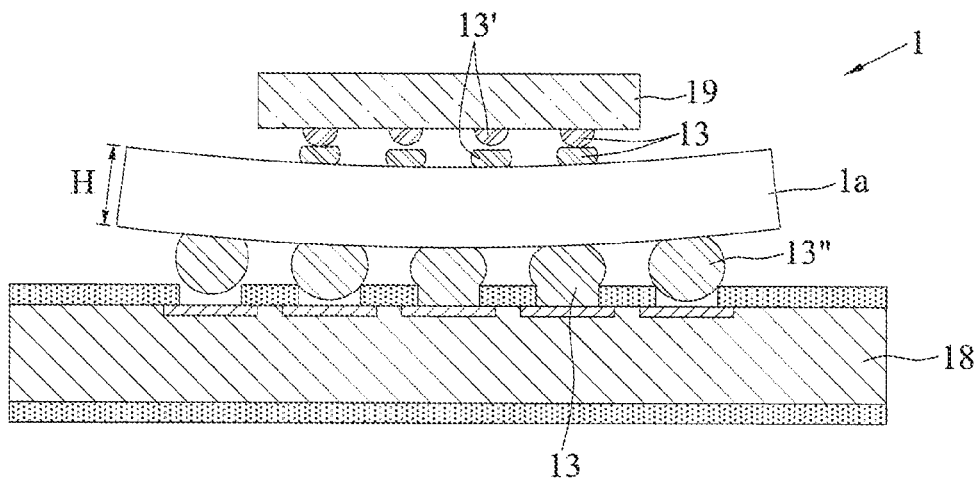
FIG. 1A is a cross-sectional schematic diagram of a traditional electronic device.
Figure 1B:
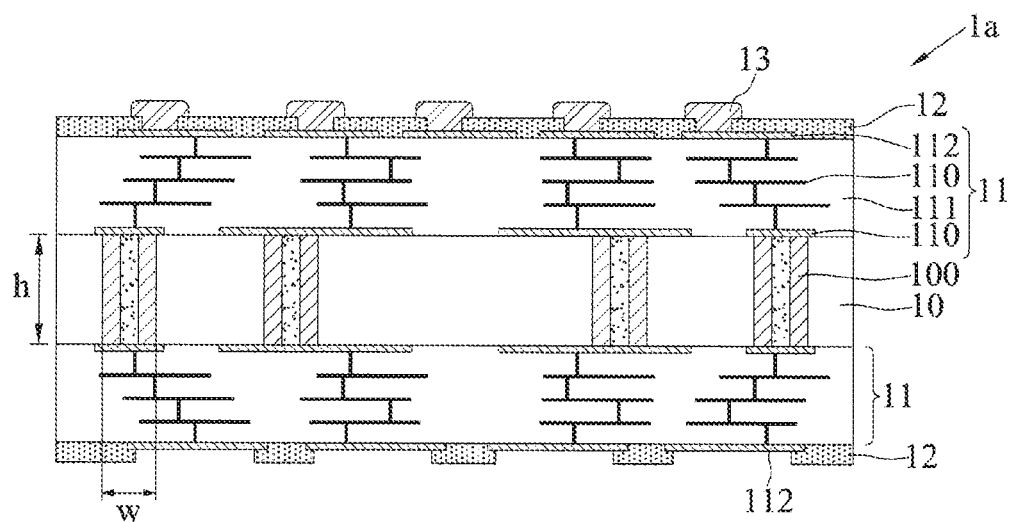
FIG. 1B is a cross-sectional schematic diagram of a traditional flip-chip package substrate.
Figure 1C:
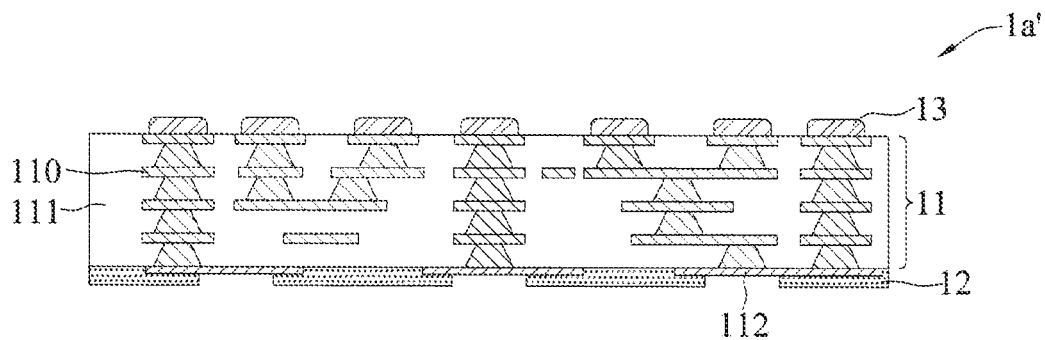
FIG. 1C is a cross-sectional schematic diagram of another traditional flip-chip package substrate.

The technical content of present disclosure is described by the following specific embodiments. One of ordinary skill in the art can readily understand the advantages and effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
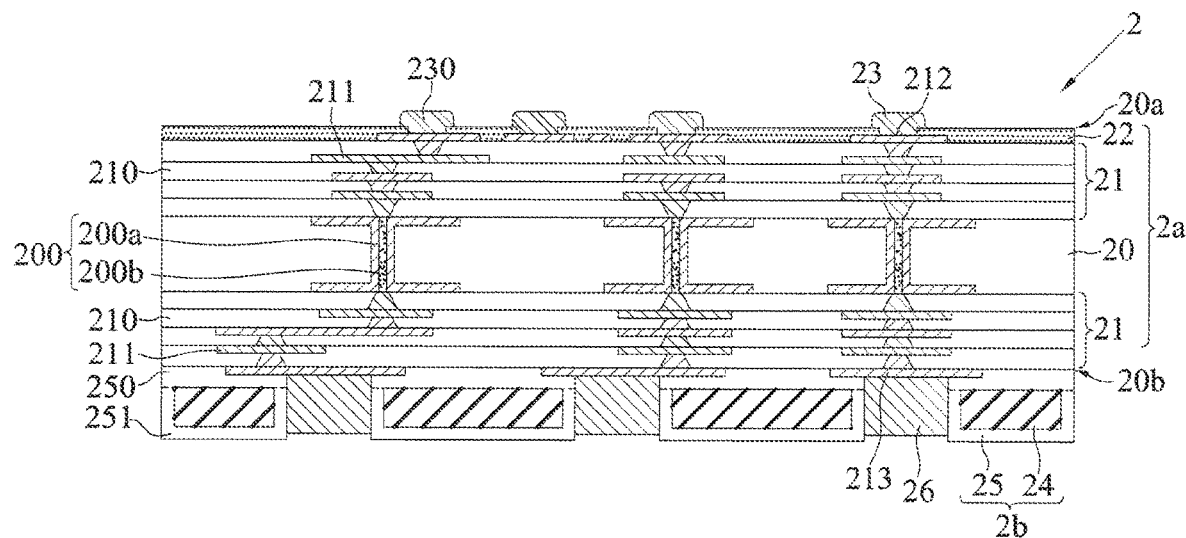
FIG. 2A is a cross-sectional schematic diagram of a flip-chip package substrate in accordance with the present disclosure.

FIG. 2A is a cross-sectional schematic diagram depicting a flip-chip package substrate 2 in accordance with the present disclosure. The flip-chip package substrate 2 includes a circuit structure 2a and a strengthening structure 2b.

The circuit structure 2a has a first side 20a and a second side 20b opposite to the first side 20a. Either one of the first side 20a or the second side 20b can be used for electronic components (e.g., semiconductor chips, passive elements, etc.) to be placed thereon. The outer side for a semiconductor chip to be placed thereon is called a "chip side." In order to facilitate illustration, the first side 20a is used as the chip side.

In an embodiment, the circuit structure 2a has a core layer 20 with a plurality of conductive portions 200 formed therein. In an embodiment, the core layer 20 can be made of a base consisting of glass fiber and organic resin, such as Bismaleimide Triazine (BT), FR4, FR5, etc., or a high-rigidity organic base containing a filler (e.g., $SiO_2$) but no glass fiber. Then, a through hole forming process, such as mechanical or laser drilling, is performed on the base, and a conductive material 200a and a filler 200b are sequentially formed in the holes. The filler 200b is formed via a plug hole process.

Figure 2B:
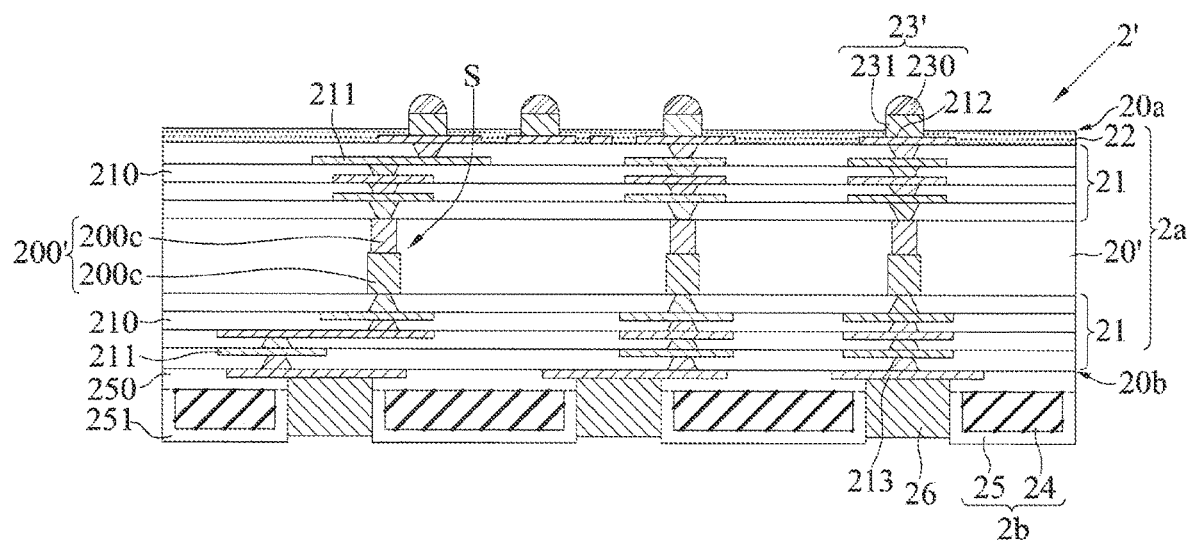
FIG. 2B is another embodiment of FIG. 2A.

In another embodiment, as shown in FIG. 2B, a core layer 20' is made of core base formed of an organic insulating material, which can be an Ajinomoto Build-up Film (ABF), a prepreg with or without glass fiber, a molding compound (e.g., an epoxy molding compound (EMC). Preferably, an EMC with high-rigidity and low thermal expansion coefficient (CTE) is used. In another embodiment, conductive portions 200' each can be composed of a single conductive pillar or a plurality of conductive pillars 200c stacked on top of one another. The widths of the at least two conductive pillars can be different, such that the junctions S of the ends of the conductive pillars 200c create step-like shapes. It can be appreciated that the number of stacking or the configurations of the peripheral surfaces of the conductive pillars 200c of the conductive portions 200' can be designed according to needs.

Therefore, the conductive portions 200, 200' can be created as a single integrated pillar or stacked pillars, and there is no specific limit on the profile shapes of the conductive portions 200, 200'.

Moreover, the circuit structure 2a further includes build-up portions 21 on the core layer 20, 20'. The build-up portion 21 includes at least one dielectric layer 210 and a plurality of circuit layers 211 joined with the dielectric layer 210. An insulating protective layer 22 or no protective layer can be formed on the build-up portion 21 corresponding to the first side 20a if needed, such that the outermost circuit layer 211 on the first side 20a can be exposed from the insulating protective layer 22 to be used as solder pads 212 for bonding with conductive bumps 23. In another embodiment, the dielectric layer 210 can be a liquid epoxy resin, a film-like ABF, a prepreg, an EMC or a photosensitive resin. The insulating protective layer 22 can be a solder resist material, such as photosensitive ink, an ABF, or non-photosensitive dielectric material (e.g., an EMC). The conductive bumps 23 include solder materials 230 (e.g., those shown in FIGS. 2A and 2B) and/or metal pillars 231 (e.g., the conductive bumps 23' shown in FIG. 2B). It can be appreciated that the number of circuit layers 211 can be designed according to needs.

The strengthening structure 2b is disposed on the second side 20b of the circuit structure 2a.

Figure 6A:
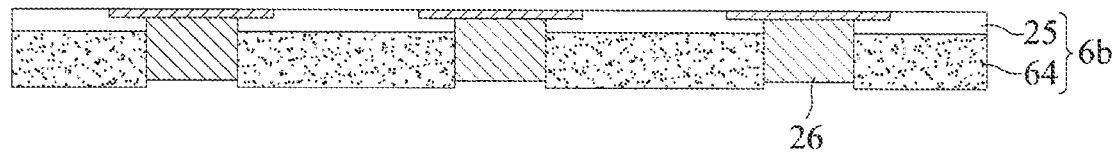
FIGS. 6A to 6C are cross-sectional schematic diagrams of a strengthening structure of the flip-chip package substrate in accordance with still another embodiment of the present disclosure.
Figure 6B:
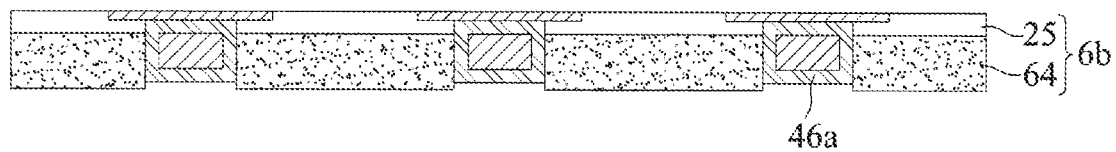
Figure 6C:
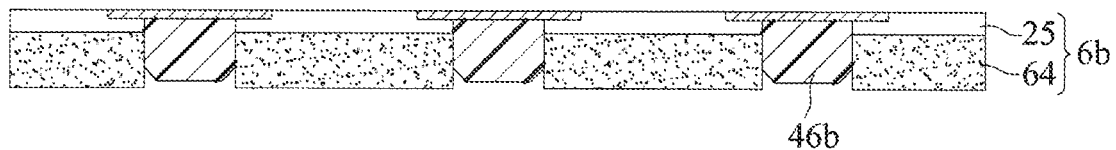

In an embodiment, the strengthening structure 2b includes a rigid layer 24 formed of a high rigidity material. In another embodiment, the rigid layer 24 can be made of materials, such as aluminum, aluminum alloy, stainless steel, copper, copper alloy, nickel iron alloy or other metal materials. In yet another embodiment, strengthening structures 6b shown in FIGS. 6A to 6C can be made of, for example, high rigidity ceramics (e.g., $Al_2O_3$ or AlN), plastic, carbon fibers or other types of insulating materials. Therefore, the materials of the rigid layers 24, 64 can be selected according to needs, and are not limited to those described above.

In an embodiment, the strengthening structure 2b includes an insulating portion 25 covering the rigid layer 24, such that the rigid layer 24 is bonded onto the second side 20b by the insulating portion 25. In another embodiment, the insulating portion 25 includes a bonding layer 250 for bonding to the second side 20b and a protective layer 251 for covering the rigid layer 24, wherein the insulating portion 25 (or the protective layer 251) can be made of an organic dielectric material (e.g., a solder resist material) or an inorganic dielectric material (e.g., an insulating oxide). More specifically, the types of the organic dielectric material further include an ABF, a prepreg, a molding compound, an EMC or a primer. The insulating portion 25 prevents electrical conduction between the metal rigid layer 24 and conductive elements 26, and also prevents short circuit.

In an embodiment, the bonding layer 250 can be made of the same material as the protective layer 251, for example, for the strengthening structures 2b shown in FIGS. 2A, 2B, 4A and 4B. In another embodiment, the bonding layer 250 can be made of a different material from the protective layer 251, for example, for the strengthening structures 5b shown in FIGS. 5A to 5C.

Figure 4A:
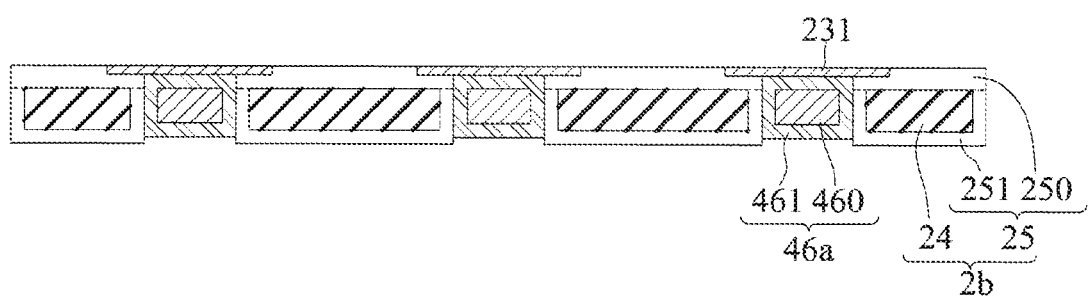
FIGS. 4A and 4B are cross-sectional schematic diagrams of a strengthening structure of the flip-chip package substrate in accordance with an embodiment of the present disclosure.
Figure 4B:
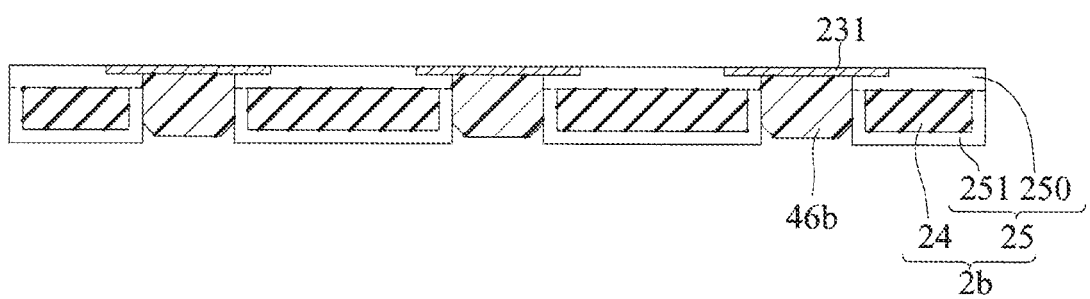
Figure 5A:
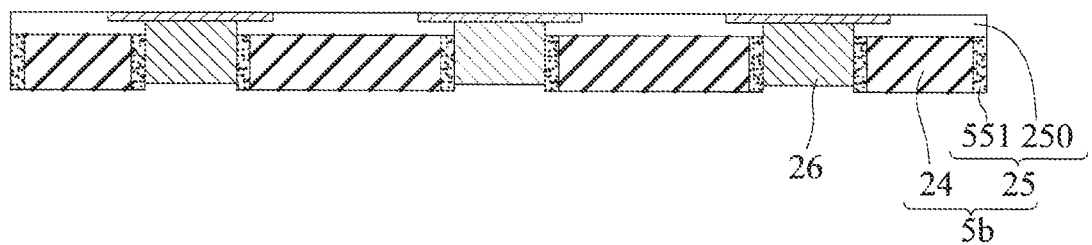
FIGS. 5A to 5C are cross-sectional schematic diagrams of a strengthening structure of the flip-chip package substrate in accordance with another embodiment of the present disclosure.
Figure 5B:
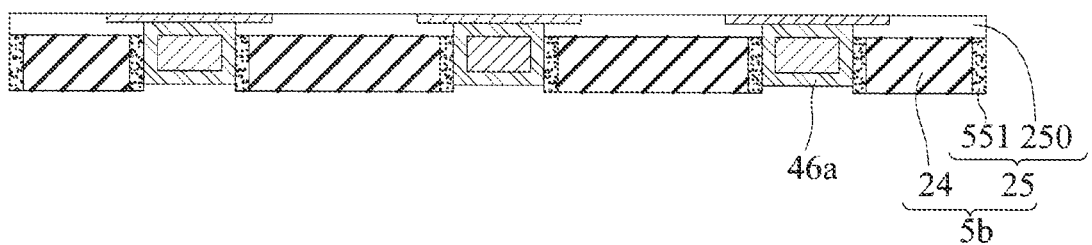
Figure 5C:
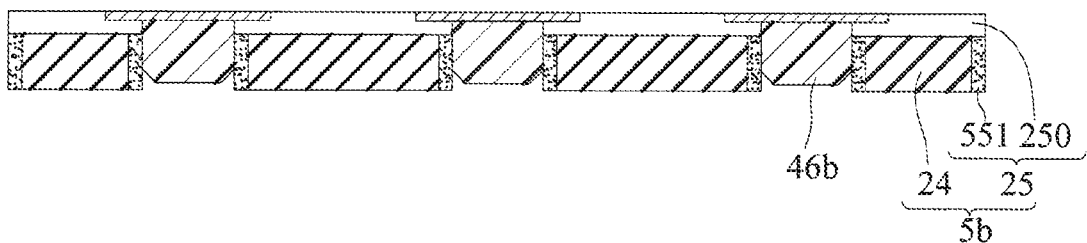

In an embodiment, the flip-chip package substrate 2 further includes a plurality of conductive elements 26 embedded in and exposed from the strengthening structure 2b. The conductive elements 26 are bonded and electrically connected with electrical contact pads 213 of the outermost circuit layers 211 on the second side 20b. In another embodiment, the conductive elements 26 are in the shape of a pillar, and can be made of copper (Cu), nickel (Ni) or copper/nickel/gold (Cu/Ni/Au), for example. In yet another embodiment, as shown in FIG. 4A, conductive elements 46a include metal bumps, such as copper bumps 460, and solder resist material 461 enclosing the copper bumps 460. In still another embodiment, as shown by conductive elements 46b in FIG. 4A, the pillar-shaped structures can be made by a metal conductive paste, such as a copper paste, a silver paste, a tin paste or tin balls.

In an embodiment, there are numerous ways of manufacturing the strengthening structures 2b, 5b, 6b. For example, the rigid layer 24, 64 can be first adhered onto the second side 20b using the insulating portion 25 (or the bonding layer 250). Openings are then formed on the insulating portion 25 to expose the electrical contact pads 213. Afterwards, the conductive elements 26, 46a, 46b are then formed in the openings to electrically connect with the electrical contact pads 213. In another embodiment, the conductive elements 26, 46a, 46b can be first formed (electroplated or placed) on the electrical contact pads 213. Then, the rigid layer 24, 64 is adhered onto the second side 20b using the insulating portion 25 (or the bonding layer 250), such that the conductive elements 26, 46a, 46b are embedded in the strengthening structure 2b, 5b, 6b (or the insulating portion 25). Thereafter, openings are formed through photolithography, etching or laser to expose the conductive elements 26, 46a, 46b. It can be appreciated that the ends of the conductive elements 26, 46a, 46b can be higher, lower or flush with the surface of the strengthening structure 2b, 5b, 6b, so that the ends of the conductive elements 26, 46a, 46b are exposed from the surface of the strengthening structure 2b, 5b, 6b.

Figure 2C:
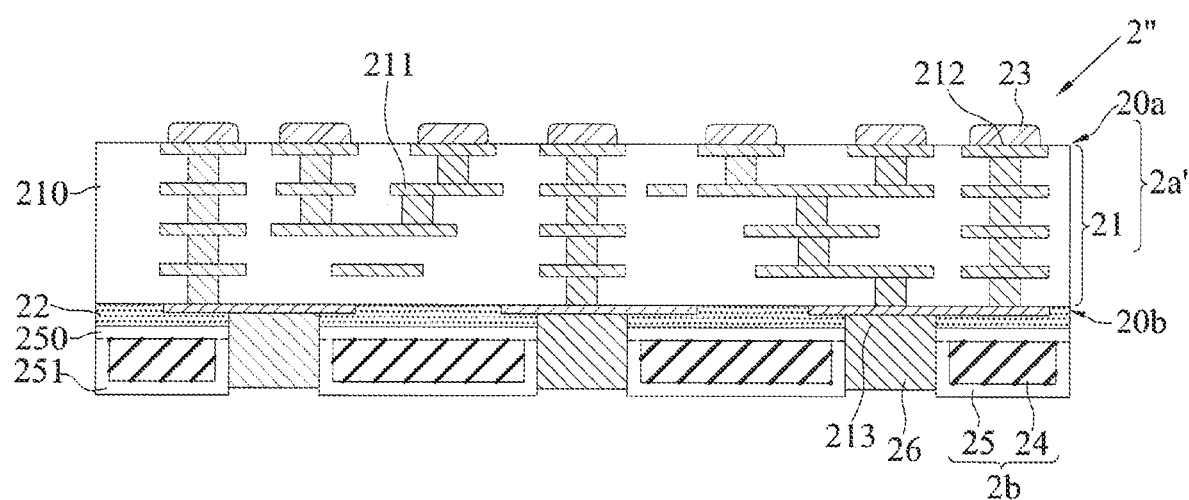
FIG. 2C is another embodiment of FIG. 2A.

As shown in FIG. 2C, a circuit structure 2*a*' of a flip-chip package substrate 2''' can be of a coreless type. The strengthening structure 2*b* is disposed on a second side 20*b* of the circuit structure 2*a*', wherein the circuit structure 2*a*' includes build-up portions 21 and an insulating protective layer 22. Interlayer electrical connections between circuit layers 211 of the build-up portions 21 are achieved by conductive pillars (or conductive blind vias), and solder pads 212 for bonding with conductive bumps 23 are embedded in a dielectric layer 210 and flush with the surface of the dielectric layer 210 (or slightly lower or higher than the surface of the dielectric layer 210) to expose the solder pads 212 from the dielectric layer 210. The insulating protective layer 22 exposes the outermost circuit layer 211 to be used as electrical contact pads 213 for conductive elements 26. It can be appreciated that the insulating protective layer 22 can be disposed or not disposed on the first side 20*a* or the second side 20*b* depending on the needs, so there is no specific limitations on the configuration of the insulating protective layer 22.

Figure 3A:
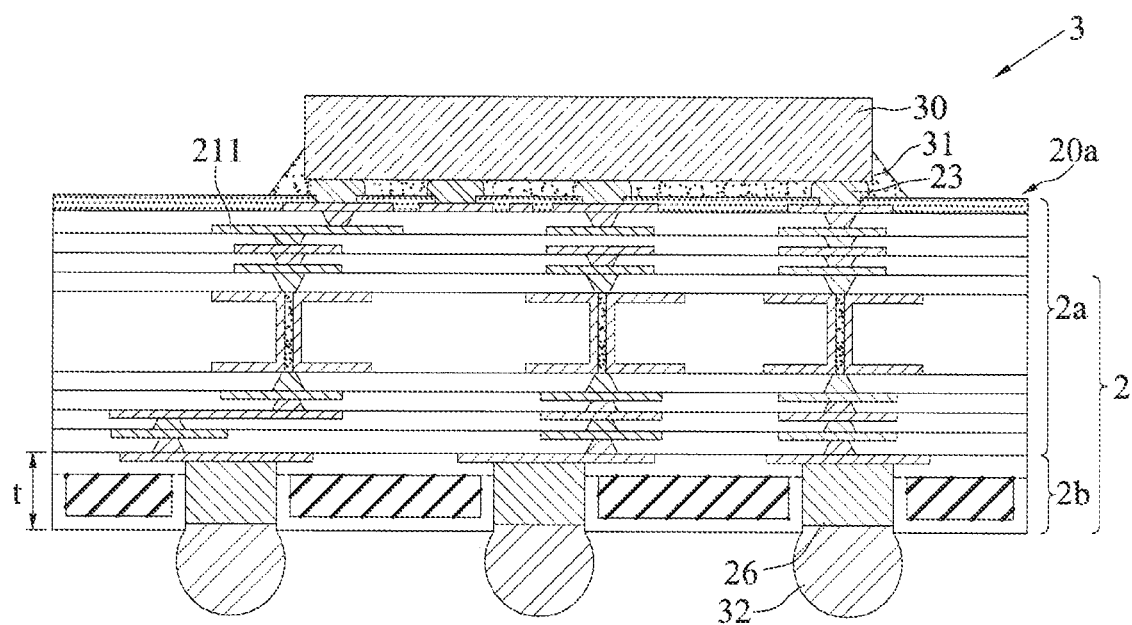
FIG. 3A is a cross-sectional schematic diagram of an electronic package in accordance with the present disclosure.
Figure 3B:
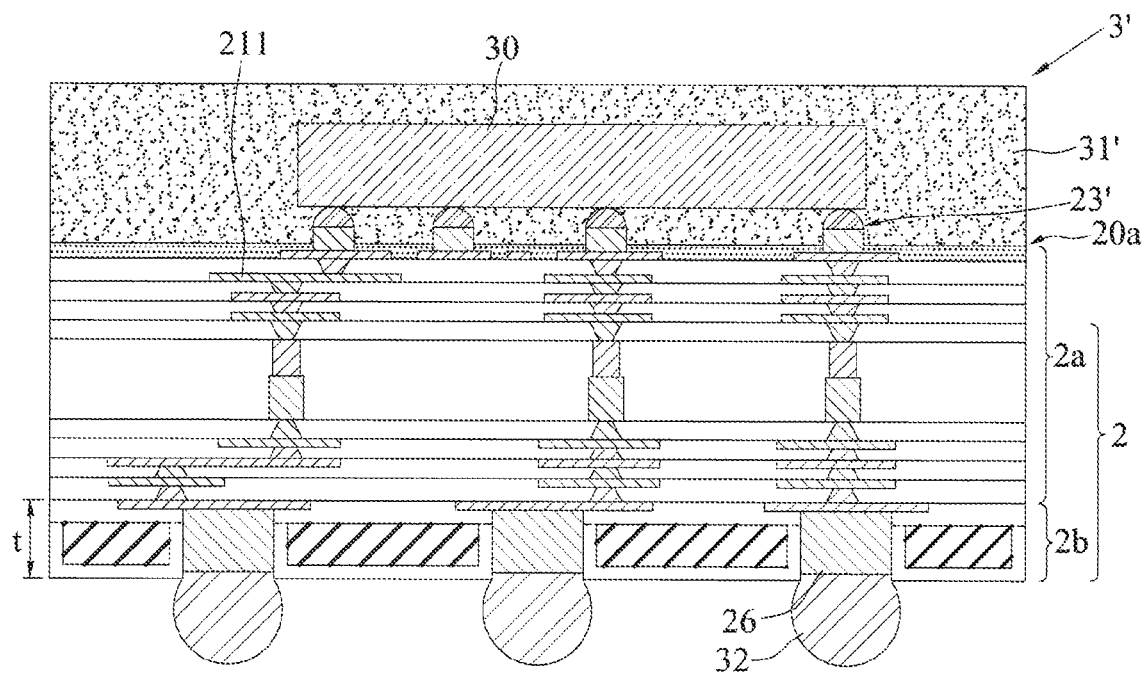
FIG. 3B is another embodiment of FIG. 3A.

FIGS. 3A and 3B are cross-sectional diagrams illustrating an electronic package 3, 3' in accordance with the present disclosure.

As shown in FIGS. 3A and 3B, at least one electronic component 30 is disposed on the first side 20*a* of the flip-chip package substrate 2, 2' shown in FIG. 2A or 2B, and an encapsulating layer 31, 31' is formed on the first side 20*a* for bonding the electronic component 30. In an embodiment, solder balls 32 can be attached on the conductive elements 26 in the strengthening structure 2*b* of the flip-chip package substrate 2, 2' to be bonded onto a circuit board (not shown).

In an embodiment, the electronic component 30 is an active element, a passive element or a combination thereof, wherein the active element can be, for example, a semiconductor chip, and the passive element can be, for example, a resistor, a capacitor or an inductor. In an embodiment, the electronic component 30 can be a semiconductor chip that is electrically connected with the circuit layers 211 of the circuit structure 2*a* via the conductive bumps 23, 23' in a flip-chip manner. In another embodiment, the electronic component can also be electrically connected with the circuit structure via a plurality of solder wires (not shown) by wire bonding. However, the way in which the electronic component is electrically connected with the circuit structure 2*a* is not limited to those just described, and the electronic component can also be disposed on the second side 20*b* or embedded in the build-up portions 21.

In an embodiment, the encapsulating layer 31 can be an underfiller formed between the first side 20*a* and the electronic component 30 to encapsulate the conductive bumps 23. In another embodiment, the encapsulating layer 31' can be a film for a laminating process, an encapsulating compound for a molding process or an encapsulating material for a printing process to encapsulate the electronic component 30 and the conductive bumps 23'. The encapsulating layer 31' can be made of, for example, polyimide (PI), epoxy or an encapsulant for molding. It can be appreciated that the encapsulating layers 31, 31' can both be used, and the packaging method of the electronic component 30 is not limited to those described above.

Figure 3C:
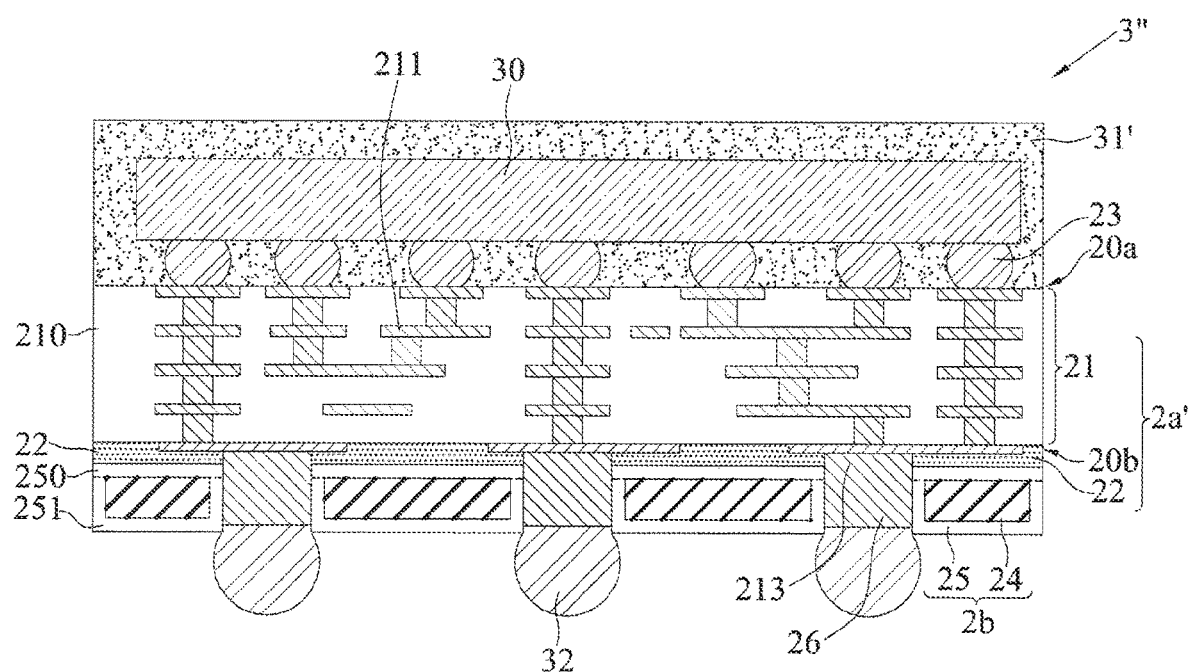
FIG. 3C is another embodiment of FIG. 3A.

In another aspect, as shown in an electronic package 3" in FIG. 3C, an electronic component 30 can also be disposed on the first side 20*a* of the circuit structure 2*a*" of the flip-chip package substrate 2" shown in FIG. 2C, the manufacturing process associated therewith is not described to avoid repetition.

In summary, the flip-chip package substrate 2, 2', 2" and the electronic package 3, 3', 3" thus packaged increase the rigidity of the flip-chip package substrate 2, 2', 2" by providing the strengthening structure 2*b*, 5*b*, 6*b* on the second side 20*b* of the circuit structure 2*a*, 2*a*'. Therefore, compared to the prior art, the flip-chip package substrate 2, 2', 2", when used for large-scale packaging, retains good rigidity even if it is thinned. As a result, in the subsequent high-temperature production process or during use, warpage of the electronic package 3, 3', 3" can be eliminated, which in turn reduces poor connection between the flip-chip package substrate 2, 2', 2" and the electronic component 30 or a circuit board.

Moreover, when the flip-chip package substrate 2, 2', 2" can be used for large-scale packaging (e.g., 55*55, 70*70, 80*80 mm$^2$), the number of layers of the build-up portions 21 of the circuit structure 2*a*, 2*a*' may be selected according to needs, so various degree of warpage may occur in the circuit structure 2*a*, 2*a*'. By adjusting the thickness t and composition of the strengthening structure 2*b*, 5*b*, 6*b*, the rigidity of the flip-chip package substrate 2, 2', 2" can be controlled. Thus, the warpage of the flip-chip package substrate 2, 2', 2" can be eliminated without having to increase the thickness of the core layer 20. On the other hand, the thickness of the core layer 20 can be reduced or no core layer 20 is even needed. As such, the ends of the conductive portions 200, 200' can be miniaturized or no conductive portions 200, 200' are needed depending on the requirements. This frees the layout of the circuit layers 211 from restrictions, and circuit layers 211 with fine lines and fine spacing can be obtained, thereby achieving high-density packaging.

Furthermore, since the thickness of the core layer 20 needs not be increased and the thickness of the core layer 20 may even be reduced, metal conductive pillars used for the conductive portions 200 may reduce resistance and improve electrical performance, thereby providing good heat dissipation.

In addition, since the core layer 20 is allowed to become thinner, manufacturing of the conductive portions 200 is less difficult, and the overall cost for manufacturing the electronic package 3 and its flip-chip package substrate 2 can be greatly reduced.

Therefore, the following effects can be achieved by the technical features according to the present disclosure.

Since the flip-chip package substrate 2, 2', 2" according to the present disclosure includes the high-rigidity strengthening structure 2*b*, 5*b*, 6*b* for providing support, the flip-chip package substrate 2, 2', 2" and the electronic package 3, 3', 3" thus packaged may be suitable for large-scale packaging and compact design.

Since the core layer 20 according to the present disclosure may maintain a small thickness, the ends of the conductive portions 200 of the present disclosure can be miniaturized, thereby achieving fine spacing between the conductive portions 200.

Since the conductive portions 200 according to the present disclosure are able to have fine spacing, or even no conductive portions 200 are required, the restrictions on the layout of the circuit layers 211 can be lifted, enabling the manufacturing of high-density circuit layers 211.

Since the core layer 20 according to the present disclosure may maintain a small thickness, the ratio of the diameter of the conductive portions 200 and the thickness of the core layer 20 will not increase, making it easier to fill the conductive through holes of the conductive portions 200 or electroplate the conductive pillars of the conductive portions 200, thereby materials can be evenly and effectively filled therein.

Since the core layer 20 according to the present disclosure may maintain a small thickness, the height of the conductive portions 200 will not increase, thus reducing the resistance and improving electrical performance.

Since the core layer 20 according to the present disclosure may maintain a small thickness, the ratio of the diameter of the conductive portions 200 and the thickness of the core layer 20 will not increase, greatly reducing the difficulty and cost in manufacturing conductive through holes in the core layer 20.

Due to the characteristics of the thick rigid layer 24 and the thin core layer 20 (or even no core layer 20) of the strengthening structure 2*b*, 5*b*, 6*b* according to the present disclosure, heat dissipation of the electronic package 3, 3', 3" can be effectively improved, which is better adapted to high temperature in the packaging process. As a result, warpage is eliminated while ensuring performance stability during operation and heating up of the end product. Moreover, when the strengthening structure 2*b*, 5*b* is a metal material, better electrical grounding can be provided, reducing noise during use.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A flip-chip package substrate, comprising:
 a circuit structure including a first side and a second side opposite to the first side, wherein either one of the first side or the second side of the circuit structure is used as a chip side for electronic components to be placed thereon, wherein the circuit structure further includes a core layer, and at least one dielectric layer and a circuit layer are formed on the core layer, and wherein the core layer includes a plurality of conductive portions electrically connected with the circuit layer, and the circuit layer has the same number of layers on upper and lower sides of the core layer;
 a strengthening structure having a top surface and a bottom surface and disposed on the second side of the circuit structure, wherein the top surface of the strengthening structure is bonded with the second side of the circuit structure and the bottom surface of the strengthening structure is free from being bonded with other circuit structures, wherein the strengthening structure is free from being electrically connected with the circuit structure, the strengthening structure includes a rigid layer made of a conductive material or an insulating material and an insulating portion covering the rigid layer, and the rigid layer is bonded onto the circuit structure by the insulating portion; and
 conductive elements having a top end and a bottom end and disposed on and electrically connected with the circuit structure, wherein the conductive elements are of a pillar-shaped structure and are positioned in the strengthening structure, wherein the top end of the conductive elements is connected with the circuit structure, and wherein the bottom end of the conductive elements is exposed from the strengthening structure and free from being bonded with other circuit structures.

2. The flip-chip package substrate of claim 1, wherein the conductive portions each include a single pillar or a plurality of stacked pillars in contact with one another.

3. The flip-chip package substrate of claim 1, wherein the conductive portions are conductive through holes.

4. The flip-chip package substrate of claim 1, wherein the insulating portion includes a bonding layer bonded to the circuit structure and a protective layer covering the rigid layer.

5. An electronic package, comprising:
 the flip-chip package substrate of claim 1; and
 an electronic component disposed on at least one of the first side and the second side of the circuit structure,
 wherein the conductive portions each are a conductive through hole, a single pillar, or a plurality of stacked pillars in contact with one another.

6. The electronic package of claim 5, further comprising an encapsulating layer disposed on the circuit structure, wherein the encapsulating layer covers and is bonded to the electronic component.

7. The electronic package of claim 5, wherein the insulating portion includes a bonding layer bonded to the circuit structure and a protective layer covering the rigid layer.

* * * * *